United States Patent
Wang et al.

(10) Patent No.: US 7,498,187 B2
(45) Date of Patent: Mar. 3, 2009

(54) METHOD FOR PRODUCING GALLIUM NITRIDE LIGHT EMITTING DIODE WAFER

(75) Inventors: Mengyuan Wang, Guangdong Province (CN); Guocong Chen, Guangdong Province (CN)

(73) Assignee: Podium Photonics (Guangzhou) Ltd., Guangzhou (CN)

( * ) Notice: Subject to any disclaimer, the term of this patent is extended or adjusted under 35 U.S.C. 154(b) by 292 days.

(21) Appl. No.: 11/426,304

(22) Filed: Jun. 24, 2006

(65) Prior Publication Data

US 2007/0254395 A1    Nov. 1, 2007

(30) Foreign Application Priority Data

Apr. 30, 2006    (CN) .................. 2006 1 0035321

(51) Int. Cl.
*H01L 21/00* (2006.01)

(52) U.S. Cl. ............... 438/46; 438/22; 438/142; 438/237; 257/E31.099; 257/E31.105

(58) Field of Classification Search ................ 438/46; 257/744
See application file for complete search history.

(56) References Cited

U.S. PATENT DOCUMENTS 6,285,123 B1 *   9/2001  Yamada et al. ............ 313/495
2004/0222524 A1 * 11/2004  Song et al. ................ 257/744

* cited by examiner

*Primary Examiner*—Walter L Lindsay, Jr.
*Assistant Examiner*—Abdulfattah Mustapha

(57) ABSTRACT

The present invention relates to a method for improving the performance of P-type ohmic contact of gallium nitride LED wafer. Magneto sputtering is used to spray nickel material in nano particles onto the surface of gallium nitride epitaxial layer. The thickness of nickel is between 1 nm to 100 nm. Following that, at least one layer of high work function metal film is deposited onto the surface of the nickel metal layer, and the ratio of the thickness of the nickel metal layer to that of high work function metal film is 1:0.5~4. Zinc oxide may replace nickel metal layer and high work function metal film. The object of the present invention is to simultaneously reduce the contact impedance of P-type luminous zone and enhance the traverse of electric current, thereby attaining an eventual equilibrium of contact impedance and luminous efficiency and thus increasing the life span of the wafer. The present invention prescribes the thickness ratio for each contact metal layer, the conditions of thermal treatment and the unique design patterns for electrodes. Experiments prove that the present invention is able to control the decay of light intensity of gallium nitride LED in 1000 hours to less than 10% with good thermal stability and contact impedance being reduced to 2E-6 $\Omega$-$cm^2$.

5 Claims, 2 Drawing Sheets

METHOD FOR PRODUCING GALLIUM NITRIDE LIGHT EMITTING DIODE WAFER

BACKGROUND OF THE INVENTION

The present invention relates to a method for producing gallium nitride light emitting diode wafer and more particularly pertains to a method for improving the performance of P-type ohmic contact of gallium nitride light emitting diode wafer.

Gallium nitride light emitting diode is a light emitting diode of ultra high brightness. It is widely used in sectors such as communications, transportation and displays as it has the features of being energy-saving, pollution-free, durable, small in size and producing shape colors. In recent years, a large volume of research work has been conducted on the development and improvement of P-type ohmic contacts of light emitting diodes with many structures being invented which basically satisfy the requirements for a functional device. For a conventional P-type ohmic contact of light emitting diode wafer, electron-beam evaporation apparatus is usually used to deposit on the surface of an epitaxial wafer one or more layers of high work function metal. For example, nickel metal is deposited by the electron beam positive deposition and then a layer of conductive metal such as gold is deposited by way of the same method, and finally alloy treatment is applied in order to reduce contact impedance. Gold is the most commonly used material for electrodes, but it has a poor thermal stability at the temperature of 500 degree Celsius or above. Accordingly, this method can reduce contact impedance but is unfavourable to the traverse of electric current on the contact surface and the inside of the wafer. This causes heat emission owing to localized surge of electric current, thereby reducing luminous efficiency of the wafer. Rapid treatment of heat is a relatively effective method in achieving good outward appearance and low contact resistivity. More advanced laser and infrared methods of heat treatment has been developed in recent years which provide better ohmic contacts. However, with the miniaturization and integration of devices, there are even more stringent requirements on the stability and reliability of ohmic contacts of gallium nitride light emitting diodes.

BRIEF SUMMARY OF THE INVENTION

In view of the aforesaid disadvantages now present in the prior art, the object of the present invention is to provide a new method for producing gallium nitride light emitting diode wafer with its thermal stability and decay resistivity enhanced, which simultaneously reduces the contact impedance of P-type luminous zone and enhances the traverse of electric current, thereby attaining an eventual equilibrium of contact impedance and luminous efficiency and thus increasing the life span of the wafer.

To attain this, the present invention generally comprises a method for producing gallium nitride light emitting diode wafer, characterized in that the first layer of electrodes of the wafer is formed by spraying nickel (Ni) material in nano particles onto the surface of P-type gallium nitride by way of magneto sputtering, and its thickness is between 1 nanometer to 100 nanometers, and following that, at least one layer of high work function metal film is deposited onto the surface of the nickel metal layer, and the ratio of the thickness of the nickel metal layer to that of high work function metal film is 1:0.5~4. Different ratios of the thickness of each metal layer above the first layer of electrodes to one another will provide different electrical properties. When the metal thickness is within the range of ratios of the present invention, the light output ratio and thermal stability of the gallium nitride light emitting diode wafer are optimized for the same types of materials.

The second layer of contact electrodes of the wafer is used in subsequent package test and wire connection. At least two layers of high work function metals are deposited by way of electron-beam or sputtering apparatus as electrodes. The materials for electrodes are chromium, platinum and gold (Cr—Pt—Au). Metal lift-off technology is used to form electrodes in symmetrical shape. The electrode pattern may be designed in the shape of a letter P and a letter d representing positive and negative connecting electrodes respectively, or in the shape of a water droplet representing positive electrode with negative electrode being represented by a shape of various forms.

As further improvement of the present invention, the first layer of electrodes undergoes a thermal treatment for 5~30 minutes at the temperature of 350~700 degree Celsius in a mixture of O2 and N2 gases.

As even further improvement of the present invention, the present invention provides a method for producing P-type contacts which has a higher degree of light transmittance and thermal stability in comparison with the first layer of electrodes formed by nickel metal layer and high work function metal film. By way of epitaxies (including MOCVD (Metal Oxide Chemical Vapor Deposition), GPE (Gas Phase Epitaxy), MBE (Molecular Beam Epitaxy) and so forth), a layer of zinc oxide (ZnO) is grown on the contact layer, or by way of production methods (including E-BEAM, SPUTTER and so forth), the layer of zinc oxide is evaporated, thereby the light transmittance of the wafer can reach 95% or above and the contact impedance and thermal stability can achieve the same performance as the conventional nickel and gold (Ni/Au).

The thermal treatment process of zinc oxide is to slowly and gradually increase the temperature inside a body at the rate of 0.1~100 degree Celsius per second, which eventually maintains at a constant temperature of 500~1000 degree Celsius and then anneals for 10 seconds to 30 minutes.

The advantages and effects of the present invention are that in comparison with the prior art, the magneto sputtering method uses magnetic-induced lattice deposit to contact metal, so that the conductive metal will be evenly distributed all over the surface and the inside of the contact metal, thereby achieving high electrical conductivity. The conductivity and luminous efficiency of the wafer will thus be better. This will simultaneously reduce the contact impedance of P-type luminous zone and enhance the traverse of electric current, thereby attaining an eventual equilibrium of contact impedance and luminous efficiency and thus increasing the life span of the wafer. The P-type ohmic contact layer made by zinc oxide is different from the conventional P-type contact luminous layer made by nickel and gold (Ni/Au) or indium tin oxide (ITO). It has better thermal stability and light emitting efficiency and is a new kind of lighting contact material for light emitting diode wafer. Meanwhile, conducting thermal treatment under the aforesaid conditions can slow down the speed of metal oxidation, so that every layer of metal particles will be in their most stable phase and the best performance of light transmittance and traverse of electric current will eventually be achieved. Experiments prove that by adaptation of the technical proposal of the present invention it is possible to control the decay of light intensity of gallium nitride light emitting diode in 1000 hours to less than 10%, and it possesses good thermal stability with the contact impedance being reduced to 2E-6 Ω-cm², which provides a stable and reliable core component for solid-state lighting of semi-conductor.

BRIEF DESCRIPTION OF THE DRAWINGS

The method for producing gallium nitride light emitting diode wafer of the present invention is further illustrated with the following drawings.

In the figures, 1. represents sapphire substrate; 2. represents gallium nitride epitaxial wafer; 3. represents nickel; 4. represents gold; 5. represents positive electrode; 6. represents negative electrode and 7. represents zinc oxide.

DETAILED DESCRIPTION OF THE INVENTION

Figure 1:
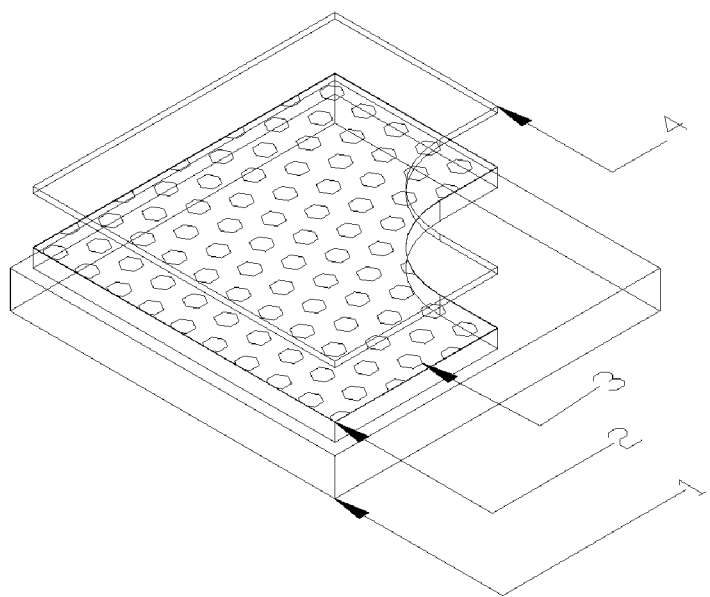
FIG. 1 shows a schematic view of the first layer of electrodes of gallium nitride light emitting diode wafer of the present invention.

The first embodiment is detailed as follows:

As illustrated in FIG. 1, gallium nitride epitaxial wafer 2 is developed on sapphire substrate 1. Applying the magnetic feature of nickel metal, sputtering system is used to spray nickel material in nano particles onto the surface of gallium nitride epitaxial wafer 2. The thickness of the nickel metal 3 is between 1 nanometer to 100 nanometers. Following that, apparatus such as electron-beam apparatus is used to deposit at least one layer of high work function metal film such as gold, platinum, palladium, chromium and so forth onto the surface of the nickel metal 3. Gold metal 4 is used in this embodiment. The thickness of gold and that of nickel metal 3 shall satisfy the ratio of 1:0.5~4, so that the light output ratio and thermal stability are optimized for the same types of materials. Certainly, the composition of the first layer of electrode metal can also be: nickel/platinum; nickel/palladium; chromium, nickel/gold; nickel, platinum/gold; tantalum, nickel/gold; tin, nickel/gold and so on, provided that the thickness of each layer of metal shall satisfy the ratio of 1:0.5~4.

When conducting thermal treatment on the first layer of electrodes, the electrodes will undergo a thermal treatment for 5~30 minutes at the temperature of 350~700 degree Celsius in a mixture of O2 and N2 gases according to different requirements for impedance and epitaxial crystalline structure so as to slow down the speed of metal oxidation. Each layer of metal particles will be in their most stable phase, thereby facilitating the enhancement of the performance of light transmittance and traverse of electric current.

Figure 3:
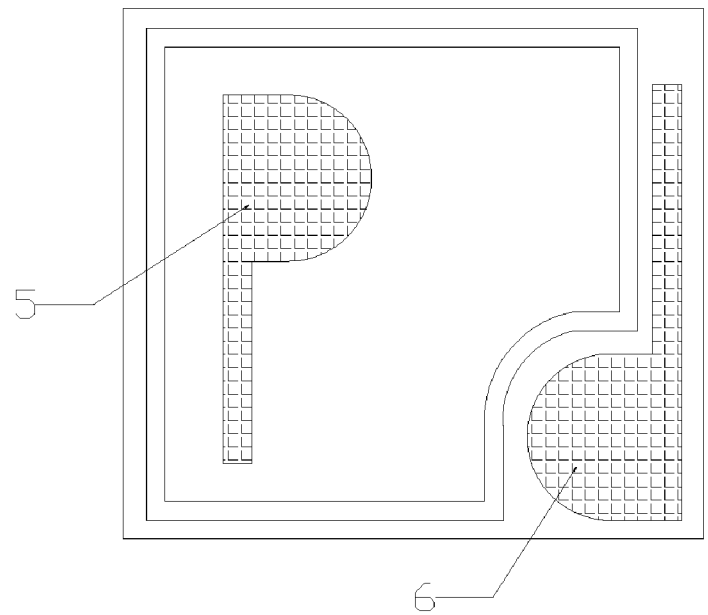
FIG. 3 shows a schematic view of the shape of electrodes of gallium nitride light emitting diode wafer of the present invention.
Figure 4:
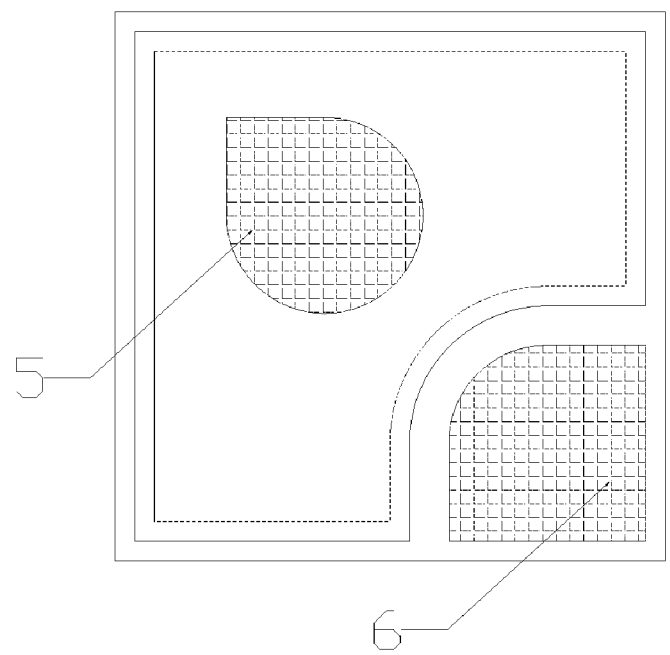
FIG. 4 shows a schematic view of another shape of electrodes of gallium nitride light emitting diode wafer of the present invention.

Thereafter, second layer of electrodes in desired pattern is layered on the surface of gallium nitride epitaxial wafer 2. The second layer of contact electrodes is used in subsequent package test and wire connection. Conventional electrode materials are: titanium/aluminum, titanium/aluminum/titanium/gold, titanium/aluminum/platinum/gold, titanium/aluminum/nickel/gold, titanium/aluminum/palladium/gold, titanium/aluminum/chromium/gold, titanium/aluminum/cobalt/gold, chromium/aluminum/chromium/gold, chromium/aluminum/platinum/gold, chromium/aluminum/palladium/gold, chromium/aluminum/titanium/gold, chromium/aluminum/cobalt/gold, chromium/aluminum/nickel/gold, palladium/aluminum/titanium/gold, palladium/aluminum/platinum/gold. The method of the present invention selectively uses chromium/platinum/gold so as to achieve good thermal stability, extremely low contact impedance and good gallium nitride adhesion. At least two layers of high work function metals are deposited by way of electron-beam or sputtering apparatus. Electrodes in the unique symmetrical shape of a letter p and a letter d are formed by metal lift-off technology, representing positive electrode 5 and negative electrode 6 respectively as illustrated in FIG. 3. Alternatively, the shape of a water droplet can be used to represent positive electrode 5 and the shape of one-fourth of a circle to represent negative electrode 6 as illustrated in FIG. 4. Such design can avoid uneven density of electric current which leads to the deficiency of uneven brightness on the surface.

Figure 2:
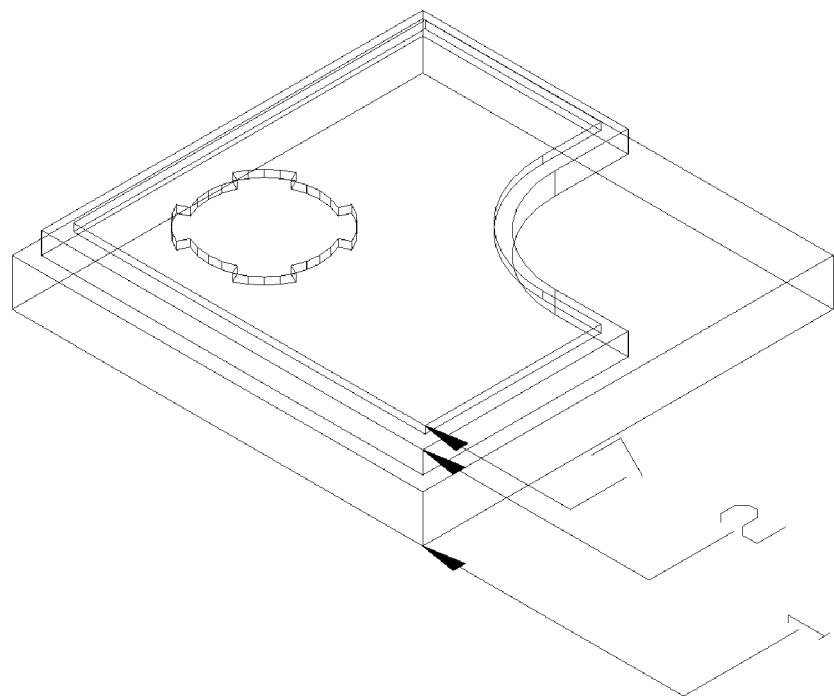
FIG. 2 shows another schematic view of the first layer of electrodes of gallium nitride light emitting diode wafer of the present invention.

The second embodiment is detailed as follows:

As illustrated in FIG. 2, the difference between this embodiment and the first embodiment is that zinc oxide 7 is used as the first layer of electrodes. The P-type ohmic contact layer made by zinc oxide is different from the conventional P-type contact luminous layer made by indium tin oxide or by nickel and gold in the first embodiment. It has better thermal stability and light emitting efficiency and is a new kind of lighting contact material for light emitting diode wafer. By way of epitaxies (including MOCVD, GPE, MBE and so forth), a layer of oxide of zinc metal, namely zinc oxide 7, is grown on the gallium nitride epitaxial wafer, or by way of production methods (including E-BEAM, SPUTTER and so forth), zinc oxide 7 is evaporated, thereby the light transmittance of the wafer can reach 95% or above and the contact impedance and thermal stability can achieve the same performance as the conventional nickel and gold. Besides the thermal treatment of zinc oxide 7 using the conventional constant temperature method, thermal treatment process by way of slow and gradual increase the temperature inside a body at the rate of 0.1~100 degree Celsius per second is specially used, which eventually maintains at a constant temperature of 500~1000 degree Celsius and then anneals for 10 seconds to 30 minutes. Therefore, P-type contact conductive layer made of such material has good performance of light transmittance and thermal stability.

What is claimed is:

1. A method for producing gallium nitride light emitting diode wafer, wherein the first layer of electrodes of the wafer is formed by spraying metal material in nano particles onto the surface of gallium nitride epitaxial layer by way of magneto sputtering, and following that at least one layer of high work function metal film is deposited onto the surface of the metal layer, and the ratio of the thickness of the metal layer to that of high work function metal film is 1: 0.5~4; the metal layer is nickel metal layer and its thickness is between 1 nanometer to 100 nanometers; the second layer of electrodes is formed with at least two layers of high work function metals are being deposited by way of electron-beam or sputtering apparatus as electrodes and metal lift-off technology is used to form electrodes in symmetrical shape; the materials for electrodes are chromium, platinum and gold; positive electrode is in the shape of a letter p and the negative electrode is in the shape of a letter d.

2. A method for producing gallium nitride light emitting diode wafer as in claim 1, wherein the positive electrode is in the shape of a symmetrical water droplet.

3. A method for producing gallium nitride light emitting diode wafer as in any of claim 1 or 2, wherein the first layer of electrodes undergoes a thermal treatment for 5-30 minutes at the temperature of 350-700 degree Celsius in a mixture of $O_2$ and $N_2$ gases.

4. A method for producing gallium nitride light emitting diode wafer, wherein the first layer of electrodes of the wafer is zinc oxide; the zinc oxide is evaporated by way of epitaxies or production methods.

5. A method for producing gallium nitride light emitting diode wafer as in claim 4 wherein thermal treatment process of the zinc oxide is by way of slow and gradual increase of the temperature inside a body at the rate of 0.1~100 degree Celsius per second, which eventually maintains at a constant temperature of 500~1000 degree Celsius and then anneals for 10 seconds to 30 minutes.

\* \* \* \* \*